(12) United States Patent
Paul et al.

(10) Patent No.: US 11,885,860 B2
(45) Date of Patent: Jan. 30, 2024

(54) SYSTEM AND METHOD FOR SETTING A FIELD OF VIEW FOR A MAGNETIC RESONANCE SCAN

(71) Applicant: Siemens Healthcare GmbH, Erlangen (DE)

(72) Inventors: Dominik Paul, Bubenreuth (DE); Hans-Peter Fautz, Forchheim (DE); Mario Zeller, Erlangen (DE); David Grodzki, Erlangen (DE); Hannah Hale, Buckenhof (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/836,048

(22) Filed: Jun. 9, 2022

(65) Prior Publication Data

US 2022/0397623 A1 Dec. 15, 2022

(30) Foreign Application Priority Data

Jun. 9, 2021 (EP) ..................................... 21178419

(51) Int. Cl.
*G01R 33/54* (2006.01)
*G01R 33/56* (2006.01)
*G01R 33/565* (2006.01)

(52) U.S. Cl.
CPC ......... *G01R 33/543* (2013.01); *G01R 33/565* (2013.01); *G01R 33/5608* (2013.01)

(58) Field of Classification Search
CPC G01R 33/543; G01R 33/5608; G01R 33/565; G01R 33/546; G01R 33/56572
See application file for complete search history.

(56) References Cited

U.S. PATENT DOCUMENTS 10,495,716 B2 * 12/2019 Schmitt ................... G06T 5/002
2016/0313434 A1 10/2016 Panther et al.
2018/0088200 A1 3/2018 Schmitt

FOREIGN PATENT DOCUMENTS

DE 102016218536 A1 3/2018

OTHER PUBLICATIONS

Doran, Simon J. et al: "A complete distortion correction for MR images: I. Gradient warp correction; Gradient warp correction of MR images"; Physics in Medicine and Biology; Institute of Physics Publishing, Bristol; vol. 50; No. 7; pp. 1343-1361; XP020084555; ISSN: 0031-9155; DOI: 10.1088/0031-9155/50/7/001; 2005.

* cited by examiner

*Primary Examiner* — G. M. A Hyder
(74) *Attorney, Agent, or Firm* — Banner & Witcoff Ltd.

(57) ABSTRACT

In a computer-implemented method for setting a field of view for a magnetic resonance scan, exclusion information describing a region of the original field of view that is unmapped owing to the distortion is ascertained on the basis of the distortion map for at least one first set of field-of-view parameters describing a rectangular or cuboidal original field of view, the exclusion information is used to determine a second set of field-of-view parameters to be used for the magnetic resonance scan, and the magnetic resonance scan is performed using the second set of field-of-view parameters.

18 Claims, 5 Drawing Sheets

SYSTEM AND METHOD FOR SETTING A FIELD OF VIEW FOR A MAGNETIC RESONANCE SCAN

CROSS REFERENCE TO RELATED APPLICATIONS

This patent application claims priority to European Patent Application No. 21178419.4, filed Jun. 9, 2021, which is incorporated herein by reference in its entirety.

BACKGROUND

Field

The disclosure relates to a computer-implemented method for setting a field of view for a magnetic resonance scan, in particular of a patient, with a magnetic resonance facility, which has a gradient coil arrangement for generating gradient fields to be used during the magnetic resonance scan for spatial encoding and a control facility. The control facility may be configured for distortion correction on the basis of a distortion map of acquired magnetic resonance data sets at least for distortions caused by imperfections of the gradient fields. The disclosure also relates to a magnetic resonance facility, a computer program product and an electronically readable data carrier.

Related Art

Magnetic resonance imaging is an imaging modality that is established in particular in the medical sector. In this case, spins inside the examination object, in particular a patient, are oriented in a strong main magnetic field (B0field). The spins are excited by way of radio-frequency pulses emitted by an appropriate radio-frequency coil arrangement, it being possible to measure the decay of the excitation as a magnetic resonance signal. To be able to also determine the location of a measurement it is known to generate by means of a gradient coil arrangement gradient fields, which are used for spatial encoding. The gradient fields should be generated such that an optimally accurate linearity is given, while for the main magnetic field it should apply that this is as homogeneous as possible.

However, on the one hand deviations from the homogeneity of the main magnetic field can occur, in particular also due to the examination object itself, but on the other hand imperfections in the gradient fields can occur, which are given in particular by a deviation from the linearity. Both effects can result in distortions during the spatial encoding. By way of what are known as distortion corrections the non-linearities can be eliminated with the aid of stored distortion information, in particular a distortion map, by way of image-based shifts of the corresponding image points. For example, it is known in the prior art to perform a calibration measurement using a phantom, whose geometry is known at least in respect of some marker points, in order to determine a distortion map at least in respect of the imperfections in the gradient fields for a particular magnetic resonance facility. The distortion map then describes by way of corresponding distortion coefficients how a particular image point is to be shifted.

One problem in this connection is that, depending on the direction of the image point shift, a reduction in the actually set, usually rectangular or cuboidal, defined field of view can occur. This means that, owing to the distortion, certain regions at the edge of magnetic resonance data sets have not been mapped during the magnetic resonance scan, so no information exists for these unmapped regions.

This problem is even more pronounced with measurements in edge regions of the homogeneity volume and in more modern magnetic resonance facilities that tend to be configured openly and freely. The user could optionally use their wealth of experience to estimate and plan the field of view to be larger, but in doing so must always know exactly how much loss occurs due to the distortion. This is dependent on slice and position, however, rendering the estimation very difficult. In addition, not every user has this kind of experience.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
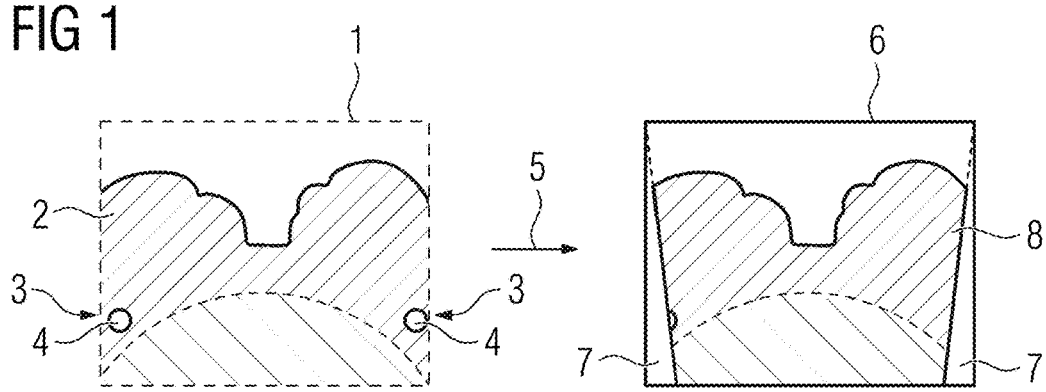
FIG. 1 shows a first schematic diagram to illustrate unmapped regions, according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to provide an improved possibility for setting fields of view on a magnetic resonance facility for scanned regions affected owing to imperfections of gradient fields by distortions.

In a method according to an exemplary embodiment of the disclosure, it is inventively provided that by way of the control facility:

exclusion information describing a region of the original field of view that is unmapped owing to the distortion is ascertained on the basis of the distortion map for at least one first set of field of view parameters describing a rectangular or cuboidal original field of view, using the exclusion information, a second set of field of view parameters to be used for the magnetic resonance scan is determined, and the magnetic resonance scan takes place using the second set of field of view parameters.

The distortion map should be considered, at least with regard to the imperfections in the gradient fields, as being magnetic resonance facility-specific. This means a distortion map ascertained, for example, on the basis of a calibration is known and is present in a storage means of the control facility. Knowledge about which shifts in location actually occur and which is used during the course of the distortion correction is also known thereby. The idea underlying the disclosure is then to use this knowledge of the distortion map as early as in the run-up to a magnetic resonance scan to enable an improved setting of the field of view. For this purpose, it is being proposed that for a, for example, predefined field of view, or one selected by the user, which is conventionally selected to be rectangular or cuboidal, it is ascertained which portions of the field of view were not mapped (unmapped region) during a magnetic resonance scan with this field of view setting and which portions were mapped (mapped region). It should be noted at this point that both the unmapped region and the mapped region can by all means be composed of a plurality of spatially separate sections, for example opposing edge sections of the unmapped region.

While it is basically conceivable to ascertain the unmapped region, and thus also the mapped region of the original field of view, by application of the distortion map to the original field of view or its image points and comparison of the result with the original field of view, an exemplary embodiment of the present disclosure, presented in more detail below, nevertheless provides applying an inverse distortion correction on the basis of the inverse distortion map to the field of view, therefore reversing as it were the distortion function used for the shift in location, because it will then also become clear which of the image points located inside the original field of view would be mapped outside of the field of view.

The resulting exclusion information, which ultimately describes a distribution of the original field of view in the mapped and unmapped regions, can be used advantageously in a variety of ways in the context of the present disclosure in order to ultimately ascertain a second set of field of view parameters, changed in particular with respect to the first set of field of view parameters, which is then used for the magnetic resonance scan. In particular, a use both for supporting a user in the selection of a field of view that is ultimately to be used is conceivable as well as an automatic improvement in the predefined and/or user-selected field of view, in particular also in combination, for example for submission of a proposal to the user. In this way the disclosure makes it possible, overall, to better ensure that the desired content is mapped and time-consuming repeat scans are avoided.

A first expedient development of the present disclosure thus provides that the original field of view to be set is displayed in a user interface, in particular together with an anatomy of the patient to be scanned, on a display facility, wherein the exclusion information is used to display the unmapped region in accordance with the exclusion information and/or for adjustment of the limitation of the field of view display for exclusion of the unmapped region. During the course of planning magnetic resonance examinations, a user interface is frequently used in which fields of view are also visualized in the user interface in a corresponding graphical representation and can thus be represented in a simplified manner. For example, the anatomy of the patient is represented, be it schematically with the aid of a model or with the aid of at least one localizer scan in which a field of view to be set, for example as a rectangular, overlaid frame, is superimposed. In this regard, the user performing the setting can be supported in two aspects. Thus, on the one hand, the unmapped region, which is lost due to the distortion, can be marked, it being possible for example to provide that the unmapped region is represented with a colored background. For example, colored sections or overlays can occur in edge regions of the, in particular rectangular, field of view still represented, from where, owing to the distortion in the current field of view setting, no magnetic resonance data can be ascertained. In a different embodiment it is also possible, however, to deviate from the rectangular or cuboidal representation of the field of view to the extent that the represented outer shape only still displays the regions that are actually also covered by the corresponding settings, are mapped therefore. In this case there are no longer any rectangular planning objects available although additional information is imparted. Of course, the two options can also be combined, so ultimately for example the unmapped region marked in color adds shape-adjusted fields of view to its original planning shape, in particular rectangles and/or squares.

Expediently, whenever a user makes a change, the visualization of the unmapped region can also be appropriately updated. Specifically, it can be provided that with a change in the field of view to be set owing to a user input, the field of view parameters describing the changed field of view to be set are used as a new first set for updating the exclusion information, whereupon the unmapped region is displayed on the basis of the updated exclusion information for the changed field of view to be set. In this way the user can "try out" as it were which changes in the mapped and the unmapped regions are produced with an adjustment of different field of view parameters.

Specifically, the second set of field of view parameters can be ascertained on the basis of a user selection of a field of view, in the case of a display as just described for example as the finally selected field of view. However, even with an automatic ascertainment, a user selection can be assumed, for example, as will be described in more detail below; in particular an expedient, general development of the disclosure can also provide, however, that the second set of field of view parameters is used only after an acknowledgement by the user, and this is expedient in particular with an automatic ascertainment of the second set by the control facility. The field of view of the second set of field of view parameters and/or the second set of field of view parameters itself can therefore be presented to the user as a proposal, which they can accept.

In an exemplary embodiment of the present disclosure it can be provided that, based on a user selection of the original field of view by way of the control facility, a second set of field of view parameters can automatically be ascertained in such a way that the represented region of the associated field of view comprises the entire selected, original field of view. In this case an automatic adjustment is given, which ensures that that which is contained in the original field of view desired by the user is actually also mapped in the magnetic resonance scan.

Specifically, it can be provided in this connection that a gradual enlargement, starting from the selected, original field of view, takes place in at least one dimension in which an unmapped region is present at the edge, for selection of first field of view parameter sets to be checked until a suitable second set of field of view parameters is found. In an exemplary embodiment, the unmapped region is ascertained by application of the inverse distortion correction in accordance with the distortion map to the original field of view and the second set of field of view parameters is selected such that the associated field of view completely comprises the application result. The application of the inverse distortion correction, the ultimately opposite shift in location compared to the actual distortion map therefore, shows which portions of the original field of view would be shifted out of this and would therefore not be represented in a magnetic resonance scan with this original field of view since they would have to have been scanned from outside. But if the field of view that is ultimately to be used, described by the second set of field of view parameters, is directly selected such that the image points shifted out of the original field of view due to the inverse distortion correction are all included, for example as the smallest rectangle comprising all these points or the smallest cuboid comprising all these points, it is immediately possible to easily "read off", without a gradual process, which expanded field of view is necessary.

An exemplary embodiment of the present disclosure provides that based on examination information describing features, in particular anatomical features, to be displayed in the magnetic resonance scan, the control facility, starting from an original field of view containing these features without taking into account the distortion and/or selected by the user, automatically checks whether the mapped region of this original field of view comprises all features to be shown, wherein in the case of the mapped region that does not comprise all features to be shown:
  a second set of field of view parameters is automatically ascertained in such a way that the mapped region of the associated field of view comprises all features to be shown, and/or
  a warning is output to the user.

These, like further embodiments of the present disclosure, which are still to be discussed below, ultimately assume that information already exists on the examination object to be scanned, in particular the patient, which information allows a localization of the features to be shown. For example, a field of view for the magnetic resonance scan of a patient can be planned on a magnetic resonance image that has already been acquired, for example a localizer image and/or another previously acquired magnetic resonance data set. Segmenting of anatomical features can already be possible in this, be it preferably automatically, be it manually and/or by way of a combination of automatic and manual procedures. If it is known, however, where these features that are to be shown are contained in an original field of view it is also possible to check whether they are contained in the associated mapped region or cannot be mapped just now due to the distortion. For example, on application of the inverse distortion correction to image points comprising these features it is possible to check here whether the image points are shifted out of the original field of view (obviously considered without taking into account the distortion) due to the inverse distortion correction. If this is the case, a new field of view, described by a second set of field of view parameters, can automatically be ascertained in such a way that all features to be shown are contained accordingly; in addition or as an alternative, a warning can be output to the user, which can induce them to adjust the field of view accordingly, for example supported by the visualizations of unmapped regions already described.

The present approach can also be particularly expediently used in the context of image control, in particular in view of necessary follow-up scans. One development of the disclosure thus provides that the first set of field of view parameters describes a used original field of view of a magnetic resonance scan that has already taken place, wherein the control facility automatically evaluates an action criterion which checks whether the portion of the unmapped region of the used field of view, which is considered without taking into account the distortion, overshoots a threshold value and/or at least one feature to be shown in the magnetic resonance scan in accordance with one item of or the examination information is located at least partially in the unmapped region, wherein when the action criterion is met a second set of field of view parameters to be used for a magnetic resonance scan still to take place is automatically ascertained in such a way that the portion of the unmapped region of the used, original field of view, again considered without taking into account the distortion, undershoots a further or the threshold value and/or the mapped region of the field of view associated with the second set of field of view parameters comprises all features to be shown. In a following automatic image check of this kind it is therefore possible to identify on the basis of the action criterion that regions were cropped, whereupon a proposal can be submitted to the user for an improved repeated measurement. The user can then accept the proposal for example and the second measurement can be performed.

As has already been stated, in an exemplary embodiment of the present disclosure, if the unmapped region is ascertained by application of the inverse distortion correction in accordance with the distortion map. This results in the particularly advantageous possibility of applying this inverse distortion correction to a mask image of the original field of view for ascertaining a resulting image, wherein the portions of the resulting image located outside of the original field of view, without considering the distortion, are identified as the unmapped region. A mask image should in particular be taken to mean that, for example owing to a binary embodiment, relevant image points can be differentiated from irrelevant image points in the original field of view. In other words, this means that the ascertainment of the unmapped region can be limited to relevant portions of the original field of view in that for example with a binary mask, only the portions that are also marked as relevant with a "1" in the resulting image are considered when ascertaining the unmapped region.

It can specifically be provided in this connection that the mask image is determined on the basis of a model and/or a magnetic resonance scan that has already taken place in such a way that it displays where in the original field of view, without taking into account the distortion, portions of the patient, in particular to be scanned, for example features to be shown in accordance with the examination information, are present, wherein for ascertaining the unmapped region only portions of the patient to be scanned in accordance with the mask image are taken into account. Portions of the patient to be scanned can of course also be given by the features to be shown, already mentioned above, in accordance with the examination information. Specifically, the mask image can be ascertained for example in such a way that the patient is segmented as a whole, a differentiation is made between air/surroundings and patient therefore, and this is easily possible for example on a localizer scan. Unmapped image points outside of the patient are not relevant, so in this way for example the consideration can be restricted to the patient themselves, the unmapped region generally describes unmapped portions of the patient therefore. It is also possible, however, to define anatomical features to be shown, for example particular organs and/or tissue parts. These can likewise be segmented by way of example in the magnetic resonance data set of a magnetic resonance scan that has already taken place, wherein, alternatively or in addition, models, for example an anatomical atlas, can of course also be used to make at least one estimation. As a tolerance a "safety zone" around the segmenting result can also be included as part of the feature. In an exemplary embodiment, the process may work solely or mainly on the basis of models, for example by way of adjustment of an anatomical atlas to a current patient, in particular using appropriate patient information.

As already stated in respect of the entire field of view, in the context of the embodiment a mask image can also be particularly advantageously provided such that a second set of field of view parameters is automatically determined in that, starting from the original field of view, an expanded field of view is determined in such a way that it comprises all unmapped regions. In this case the entire original field of view does not have to be included, therefore, instead the consideration is particularly advantageously restricted to portions that are actually relevant, for example those which show the patient generally and/or particular features to be shown. An enlargement of the field of view is thus performed only and to the extent of when and insofar as relevant features are affected.

One development of the disclosure provides that with enlargement of the field of view described by the second set of field of view parameters with respect to the original field of view, the resolution is increased, in particular corresponding to the degree of the enlargement. It is basically conceivable for the same resolution to be retained but it is more expedient to increase the resolution accordingly, so the user the can obtain the expected image impression even despite the enlarged field of view. In particular, the resolution can be increased in such a way that in the final magnetic resonance image data set, which is acquired with the second set of field of view parameters, the same effective resolution is obtained, which was also expected in respect of the original field of view.

Apart from the method the disclosure also relates to a magnetic resonance facility, which has a gradient coil arrangement for generating gradient fields to be used during the magnetic resonance scan for spatial encoding and a control facility, wherein the control facility is designed for distortion correction on the basis of a distortion map of acquired magnetic resonance data sets at least for distortions caused by imperfections in the gradient fields, wherein the control facility is designed for carrying out the inventive method. All statements in respect of the inventive method may be transferred analogously to the inventive magnetic resonance facility, so the advantages already mentioned above can also be obtained with the magnetic resonance facility.

The control facility can have in particular at least one processor and at least one storage means. Functional units can be implemented by way of hardware and/or software to be able to carry out different steps of the inventive method. In particular, the control facility can comprise an ascertainment unit for the exclusion information, a determination unit for the second set of field of view parameters and a sequence unit for controlling the magnetic resonance scan per se, in particular also using the second set of field of view parameters.

An inventive computer program product can be loaded directly into a storage means of a control facility of a magnetic resonance facility and has program means in order to carry out the steps of an inventive method when the computer program is run on the control facility. The computer program product can be stored on an electronically readable data carrier in accordance with the present disclosure, which therefore comprises electronically readable control information stored thereon, which comprises at least one inventive computer program and when the data carrier is used in a control facility of a magnetic resonance facility actuates it to carry out the steps of an inventive method. The electronically readable data carrier can in particular be a non-transient data carrier, for example a CD-ROM.

Figure 2:
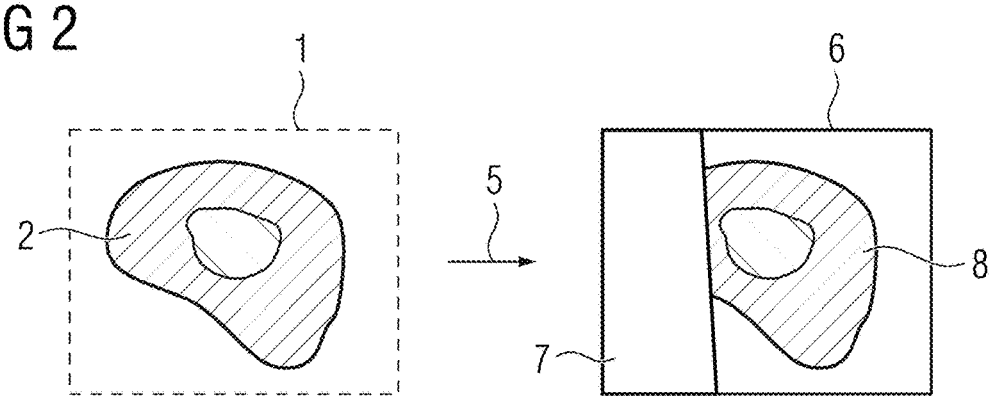
FIG. 2 shows a second schematic diagram to illustrate unmapped regions, according to an exemplary embodiment.

FIGS. 1 and 2 illustrate as schematic diagrams the problem underlying the present disclosure. FIG. 1 shows by way of example a field of view 1 selected for a breast examination, with an indicated anatomy 2 to be scanned, which also comprises as the features 3 to be shown in accordance with examination information the lymph nodes 4 located at the edge and schematically emphasized here. If a magnetic resonance scan takes place with this field of view 1 in accordance with the arrow 5, more precisely with corresponding field of view parameters, then a magnetic resonance data set 6 is obtained following the distortion correction using a distortion map, which describes shifts in location by way of distortion coefficients, for which data set no image data exists in an unmapped region 7 within the field of view 1. In the present example this unmapped region 7 unfortunately also at least partially comprises the lymph nodes 4. In other words, magnetic resonance signals apparently originating from positions within the unmapped region 7 were shifted image point-wise in the course of the distortion correction to their actual positions, wherein, owing to the imperfections in the gradient fields, no magnetic resonance data existed which was to be shifted into the unmapped region 7.

FIG. 2 shows a corresponding further example in which an arm was to be scanned as the anatomy 2, it being evident in the magnetic resonance data set 6 there, owing to the situation of the arm at the edge in the homogeneity volume, that a very large portion is not mapped and therefore forms part of the unmapped region 7. In such cases the situation can occur where not every required item of information is contained in the correspondingly mapped region 8.

Figure 3:
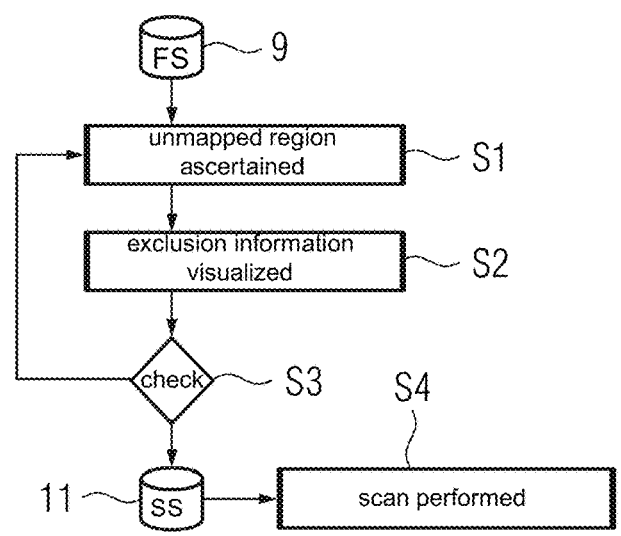
FIG. 3 shows a flowchart of a method according to an exemplary embodiment.

FIG. 3 shows a flowchart of a first exemplary embodiment of an inventive method. In this case a first set 9 of field of view parameters is assumed, which describe an original field of view 1, which can be selected and/or predefined for example by a user. In the present case the user himself wants to set a suitable field of view 1 for the following magnetic resonance scan of a patient by means of a user interface, which is represented on a display facility. The first set 9 of field of view parameters therefore corresponds in particular to an original field of view 1 currently represented in the user interface, with a corresponding user interface 9 being schematically indicated in FIG. 4. Represented in a section there is the anatomy 2 of the patient, for example from a localizer scan or another previously acquired magnetic resonance data set, which is visualized in respect also of the currently set field of view 1 with the current, first set 9 of field of view parameters.

In accordance with the method in FIG. 3, the unmapped region 7 is already ascertained before the beginning of the magnetic resonance scan in a step S1 using the distortion map stored in a storage means of the control facility of the magnetic resonance facility. This can take place on the one hand by application of the distortion map, the customary distortion correction therefore, to each image point of the original field of view 1, so it is possible to see from which portions of the field of view 1 image points are shifted without other image information being present. It is also conceivable, however, to apply an inverse distortion correction to the original field of view 1 and in the process to monitor which image points of the original field of view 1 are shifted out of it, from which it is possible to conclude that these image points form part of the unmapped region 7. In each case, exclusion information exists at the conclusion of step S1, which describes the distribution of the field of view 1 in the unmapped region 7 and the mapped region 8.

Figure 4:
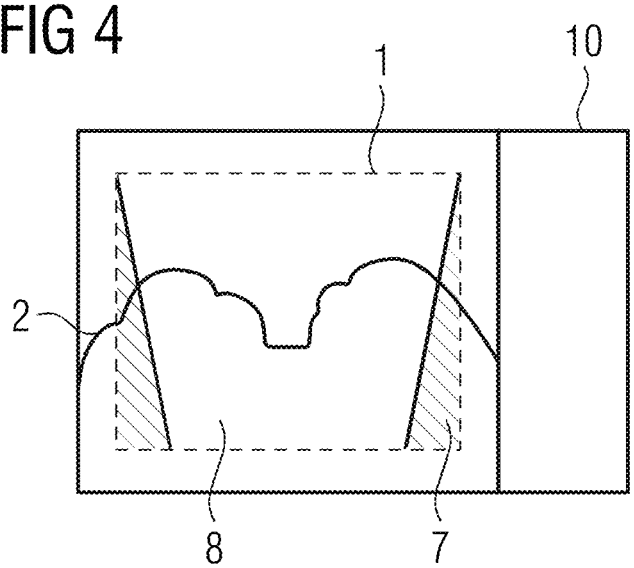
FIG. 4 shows an example display in a user interface according to an exemplary embodiment.
Figure 5:
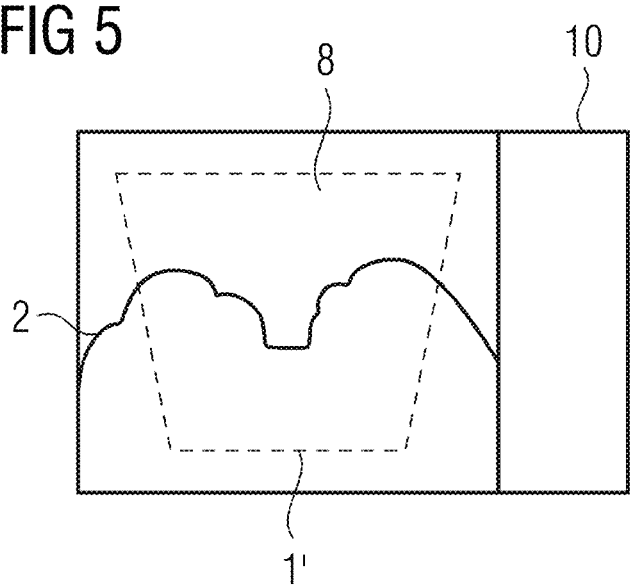
FIG. 5 shows an example display in a user interface according to an exemplary embodiment.

In a step S2, the exclusion information is visualized in the user interface 10 in order to support the user. Two specific approaches exist for this, which can also be used in combination and which are schematically represented in FIGS. 4 and 5. In accordance with FIG. 4, the unmapped region 7 is displayed in accordance with the exclusion information itself, for example by colored overlaying or coloring, as is indicated by the hatching in FIG. 4. The user can immediately see therefore where unmapped portions are located within the field of view 1. In accordance with the option of FIG. 5 the display of the field of view 1 is itself modified in that an adjusted limitation 1' is represented, which encloses only the mapped region 8 in accordance with the exclusion information. In this case, there is therefore a departure from the rectangular field of view limitation and it is modified for the visualization of non-represented regions 7, here indirectly. It should be noted at this point that basically a rectangular or cuboidal field of view 1, as known, is assumed for the original field of view 1.

In a step S3 in accordance with FIG. 3 it is then checked whether, owing to a user input, changes in the field of view 1 to be set were made, or whether the field of view 1 to currently be set is accepted and thus the current first set 9 of field of view parameters was acknowledged by the user as the second set 11 of field of view parameters for the magnetic resonance scan taking place in step S4. In the case of a change in the field of view 1 to be set, the changed set of field of view parameters is set as the new first set 9 of field of view parameters and the process returns to step S1, so the display in the user interface 10 is also completely automatically updated.

Figure 6:
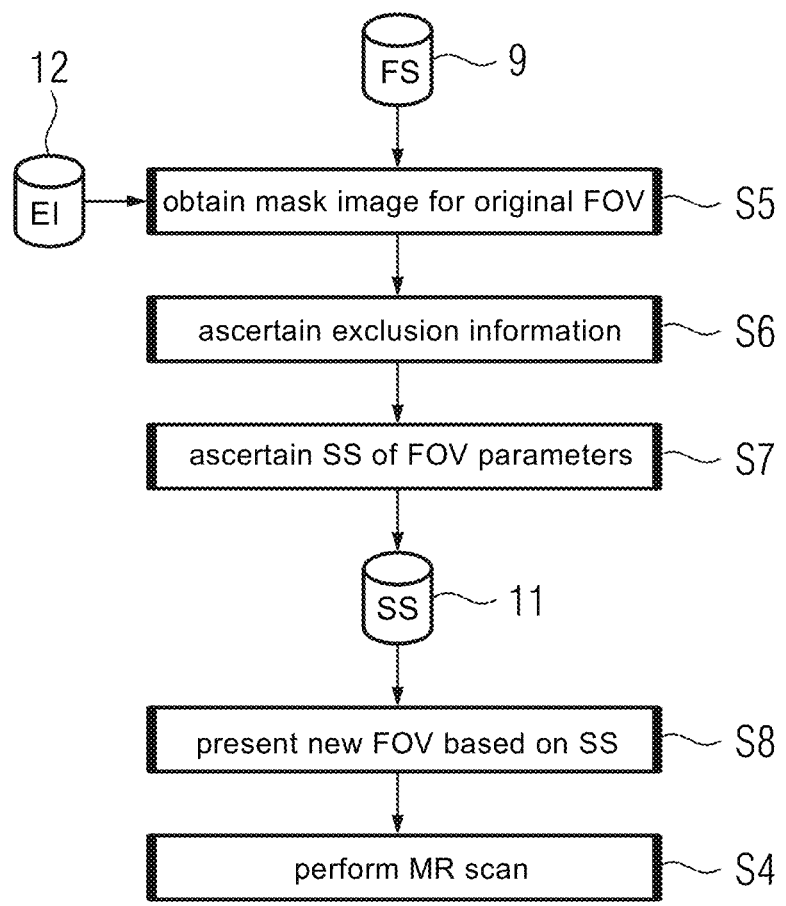
FIG. 6 shows a flowchart of a method according to an exemplary embodiment.

FIG. 6 illustrates a second exemplary embodiment of the inventive method. It should be noted in this connection that the first and the second exemplary embodiments can also be at least partially combined, for example in that a user setting by means of the user interface 10 results in the first set 9, which is then automatically improved, or in that a user adjustment follows an automatic determination of a proposal for a second set 11; finally it is of course also conceivable to offer both procedures (on the part of the user by implementation of supported setting/automatic ascertainment of a proposal) in the control facility for selection.

A first set 9 of field of view parameters, which describe an original field of view 1, is also assumed in the second exemplary embodiment of the inventive method. This can also be, in particular, a used field of view of a previous magnetic resonance scan for which an action criterion is met, whereby features to be shown are not mapped or an excessively large portion is not mapped.

From this first set 9 a second set 11 of field of view parameters should now be ascertained using the exclusion information, the associated field of view of which set is improved with regard to distortions that occur and unmapped regions 7. It is basically conceivable to determine the second set 11 of field of view parameters in such a way that the entire original field of view 1 is contained in the associated new field of view. An exemplary embodiment can be limited in the evaluation to non-represented portions of the patient which can be segmented for example in the localizer image or the previously acquired magnetic resonance data set since unmapped air image points or surroundings image points of the original field of view can be evaluated as being irrelevant. However, in an exemplary embodiment, examination information 12 is provided, which describes features 3, in particular anatomical features therefore, to be shown in the magnetic resonance scan to be performed. Nevertheless, it should be noted that the examination information 12 in FIG. 6 can of course also mention the patient generally as a feature 3 to be shown.

The examination information 12 is used in a step S5 to ascertain a mask image for the original field of view 1, described by the field of view parameter of the first set 9. In an exemplary embodiment, the mask image may be a binary image, which for features 3 to be shown, which can be segmented for example in the localizer image and/or the previously acquired magnetic resonance image data set, in particular also with the aid of an anatomical atlas, so a simple request for image points located within the original field of view 1 (in its shape without taking into account distortions, in particular rectangular shape or cuboidal shape, therefore) can be made, whether the image point in accordance with the segmenting forms part a feature 3 to be shown or not. Segmenting results can also be expanded by a tolerance range in order to cover inaccuracies in the segmenting and the like. If an image point forms part of a feature 3 to be shown, which, as stated, can also be the entire anatomy 2, the corresponding image point of the mask image is given the value "1", and otherwise the value "0". The value "1" describes relevant portions of the field of view 1, the value "0" describes irrelevant portions of the field of view 1.

In a step S6, exclusion information is then determined again, but in this case by application of the inverse distortion correction to the mask image, it being possible, in particular as early as at this point, for only the relevant portions to still be considered. In each case only relevant image points in accordance with the mask image are then used for ascertaining the unmapped regions 7.

Figure 7:
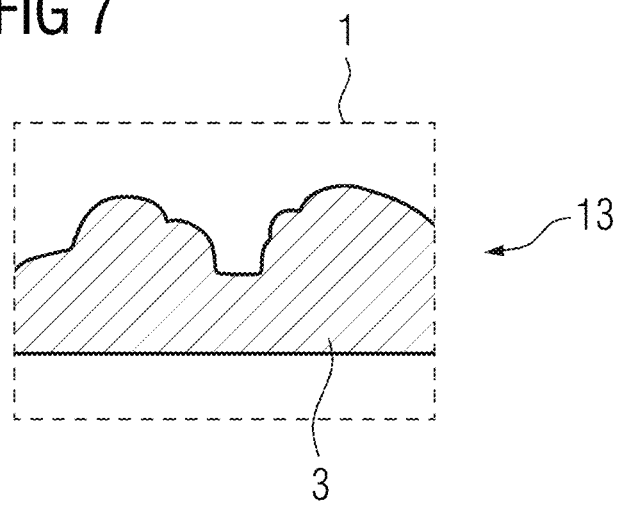
FIG. 7 shows an ascertained mask image in an original field of view according to an exemplary embodiment.
Figure 8:
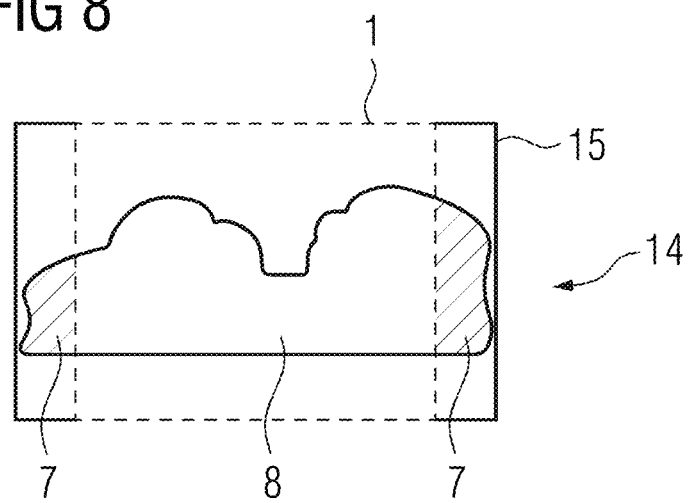
FIG. 8 shows a diagram for ascertaining an enlarged field of view according to an exemplary embodiment.

This will be schematically illustrated in more detail in accordance with FIGS. 7 and 8. FIG. 7 schematically shows a mask image 13, ascertained in accordance with step S5 within the original field of view 1, for a feature 3 to be shown. The mask image 13 was binarily developed, in other words in image points in which the feature 3 to be shown is present has the value "1", and otherwise the value "0". It should be noted that of course it is also possible, for example depending on the type of segmenting results, to work with values between 0 and 1 in the sense of a probability that the feature 3 to be shown is present in the image point, it then being expediently possible to use a threshold value for differentiation between relevant and non-relevant image points.

FIG. 8 then shows the mask image 13 treated with the inverse distortion correction, in other words the inverted spatial shifts in comparison with the distortion map, the resulting image 14 therefore. It is evident that relevant image points have been moved out of the original field of view 1, so they form part of the unmapped region 7. This makes it easily possible to determine in a step S7 in accordance with FIG. 6 a second set 11 of field of view parameters in such a way that the associated field of view 15 contains precisely the shifted image points of the features 3 to be shown, in other words the unmapped region 7, for example as the smallest rectangle or cuboid comprising both the mapped region 8 as well as the unmapped region 7 in the at least one relevant dimension where unmapped edge regions are present. This is schematically represented in FIG. 8.

In a step S8 the new field of view 15 corresponding to the second set 11 of field of view parameters can be presented as a proposal to the user, who can acknowledge it. Once the acknowledgement is received, the magnetic resonance scan takes place in step S4 with the second set 11 of field of view parameters.

It should also be noted at this point that the examination information 12 in exemplary embodiments can also be used to automatically ascertain or predefine the first set 9 of field of view parameters. For example, firstly an original field of view 1 can be ascertained in such a way that it contains features 3 to be shown, predefined by the examination information 12, as a rectangle or cuboid, whereby steps S5 to S8 and S4 can then follow based on this.

It can also be provided, with enlargement of the field of view 15 described by the second set 11 of field of view parameters with respect to the original field of view 1, that the resolution is increased. It is basically conceivable to retain the same resolution, but more expedient to enlarge the resolution accordingly, so the user can obtain the expected image impression even despite the enlarged field of view 15. In particular, the resolution can be increased in such a way that the same effective resolution is obtained in the final magnetic resonance image data set, which is acquired with the second set 11 of field of view parameters, which was also expected in respect of the original field of view 1.

Figure 9:
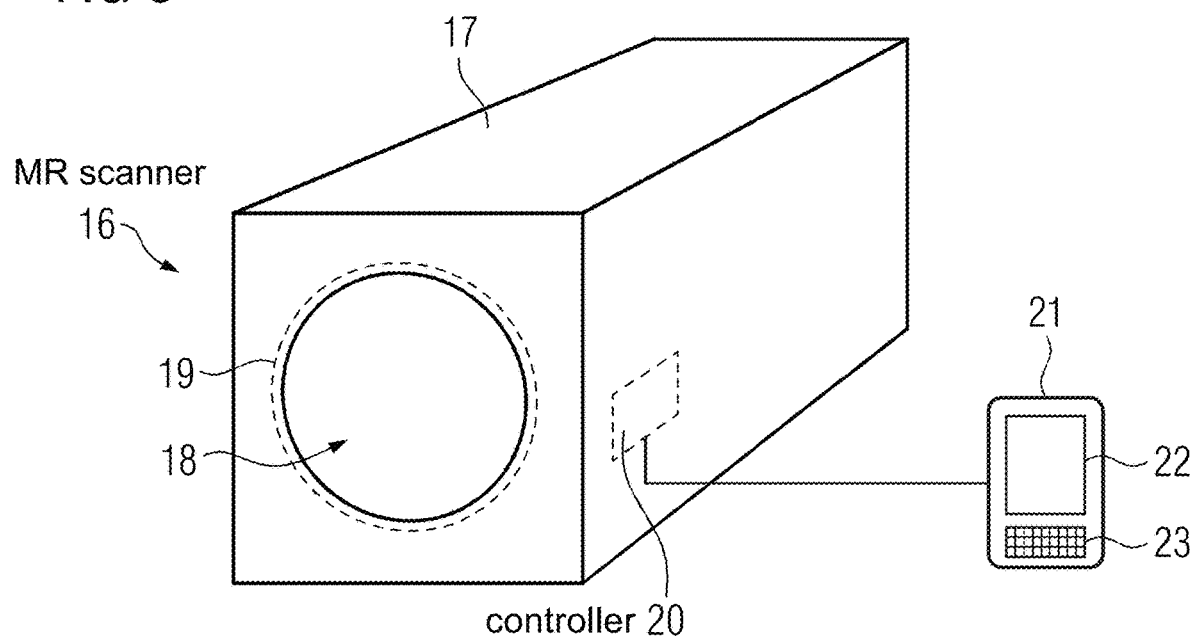
FIG. 9 shows an inventive magnetic resonance scanner according to an exemplary embodiment.

FIG. 9 schematically shows an exemplary embodiment of an inventive magnetic resonance (MR) facility (MR scanner) 16. Conventionally, the MR scanner 16 may include a main magnet unit 17 with the main magnet for generating the main magnetic field, the main magnet unit 17 having a cylindrical patient receptacle 18 into which the patient can be moved using a patient couch (omitted for brevity). A radio-frequency coil arrangement (omitted for brevity) and a gradient coil arrangement 19 are provided so as to surround the patient receptacle 18.

Operation of the MR scanner 16 is controlled by a control facility (controller) 20, to which an operator facility (computing device) 21 may be communicatively connected. The computer device 21 may include a display 22 (and/or other output interface) and an input 23, such as a keyboard, touchscreen, microphone, or other input interface. The controller 20 may include at least one processor and at least one storage means (e.g. one or more memory units). In an exemplary, the controller 20 includes processing circuitry that is configured to perform one or more functions and/or operations of the controller 20.

Since imperfections in the gradient fields of the gradient coil arrangement 19 can exist, a distortion map is stored in the storage means as distortion information, with the controller 20 being designed to correct acquired magnetic resonance data sets with regard to the distortions, resulting due to the imperfections in the gradient fields, by means of the distortion map. It should be noted that even if this has not been explicitly described in respect of the method, a distortion correction with the distortion map obviously also takes place for the magnetic resonance data set acquired in step S4 or, generally, for magnetic resonance data sets acquired with the second set 11 of field of view parameters.

Figure 10:
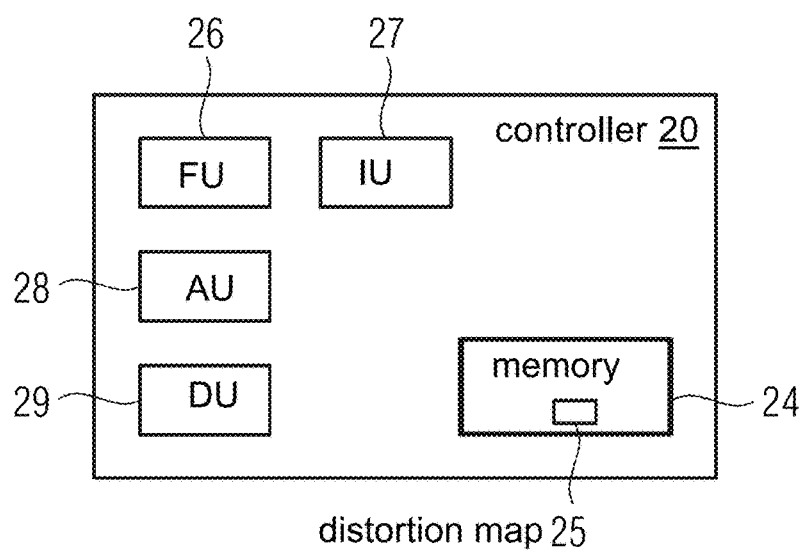
FIG. 10 shows a controller according to an exemplary embodiment of the magnetic resonance scanner.

FIG. 10 shows the functional structure of the controller 20 in more detail. As already mentioned, this has the storage means 24 in which, for example, the distortion map 25 is already stored, but which can of course be used for other data occurring for and during the inventive method, for the implementation of which the controller 20 is designed, for example sets 9, 11 of field of view parameters, examination information 12, mask images 13 and the like. In an exemplary, one or more of the components (24-29) of the controller 20 includes processing circuitry that is configured to perform one or more respective functions and/or operations of the component(s). The components 26-27 may represent functional blocks or modules of one or more processors of the controller 20 which perform the functions as described herein. In some instances, the functions performed by the respective blocks may be implemented via any suitable type of processing circuitry or other suitable components. The functionality assigned to the functional blocks of the controller 20 as discussed herein is provided for ease of explanation and is non-limiting, as these functions may be shared among the functional blocks or performed by different or alternative blocks not shown in the Figures.

The controller 20 comprises as functional units firstly a basically known frequency unit 26 for controlling the magnetic resonance scans, also in step S4, as well as a user interaction unit 27 for user interaction by means of the operating facility 21. In particular, the interaction unit 27 can also be designed for at least partial implementation of steps S3 and S8.

The exclusion information can be ascertained in an ascertainment unit 28, cf. steps S1 and S6 in this regard. The determination of the second set 11 of field of view parameters, optionally assisted by the interaction unit 27, can then take place in a determination unit 29, cf. in particular also step S7 for automatic ascertainment. It should be noted that step S2 is at least partially also implemented by the interaction unit 27.

Although the disclosure has been illustrated and described in detail by the exemplary embodiments, it is not limited by the disclosed examples and a person skilled in the art can derive other variations herefrom without departing from the protective scope of the disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A computer-implemented method for setting a field of view for a magnetic resonance (MR) scan of a patient with a MR scanner including a gradient coil arrangement configured to generate gradient fields to be used during the MR scan for spatial encoding and a controller configured to perform distortion correction based on a distortion map of acquired magnetic resonance data sets at least for distortions caused by imperfections of the gradient fields, the method comprising:
   ascertaining, by the controller, exclusion information describing an unmapped region of an original field of view based on the distortion map for at least one first set of field-of-view parameters describing a rectangular or cuboidal original field of view, the unmapped region resulting from the distortion;
   displaying the original field of view to be set in a user interface together with an anatomy of the patient to be scanned, wherein the unmapped region is displayed based on the exclusion information and/or a limitation of the field of view display for exclusion of the unmapped region is adjusted based the exclusion information;
   determining, by the controller, a second set of field-of-view parameters to be used for the MR scan based on the exclusion information; and
   controlling, by the controller, the MR scanner to perform the magnetic resonance scan using the second set of field-of-view parameters.

2. The method as claimed in claim 1, wherein, with a change in the field of view to be set in response to a user input, the exclusion information is updated based on a new first set of field-of-view parameters that include field-of-view parameters describing the changed field of view to be set, the unmapped region resulting from the updated exclusion information being displayed for the changed field of view to be set.

3. The method as claimed in claim 1, wherein the second set of field-of-view parameters is ascertained based on a user selection of a field of view during the display of the original field of view.

4. The method as claimed in claim 3, wherein, based on the user selection of the original field of view by the controller, the second set of field-of-view parameters is automatically ascertained such that a represented region of the associated field of view comprises an entire selected original field of view.

5. The method as claimed in claim 4, further comprising, by the controller, gradually enlarging the selected original field of view in at least one dimension in which the unmapped region is present at an edge to select the first view parameter sets to be checked until a suitable second set of field-of-view parameters is found.

6. The method as claimed in claim 4, further comprising, by the controller:
applying inverse distortion correction to the original field of view to ascertain the unmapped region based on the distortion map; and
selecting the second set of field-of-view parameters such that the associated field of view completely comprises a result of the application of the inverse distortion correction.

7. The method as claimed in claim 1, wherein:
based on examination information describing anatomical features to be shown in the MR scan, automatically checking, by the controller, whether the mapped region of this original field of view comprises all features to be shown, starting from an original field of view containing the anatomical features without considering the distortion and/or from an original field of view selected by the user; and
in response to the mapped region not comprising all of the anatomical features to be shown:
automatically ascertaining, the second set of field-of-view parameters such that the mapped region of the associated field of view comprises all features to be shown, and/or
generating and outputting a warning to the user.

8. The method as claimed in claim 1, wherein:
the first set of view parameters describes a used, original field of view of a previously performed magnetic resonance scan, the controller automatically evaluating an action criterion to check whether the portion of the unmapped region of the used field of view, without taking into account the distortion, exceeds a threshold value and/or whether at least one feature to be shown in the magnetic resonance scan in accordance with an item of the examination information is located at least partially in the unmapped region, and
in response to the action criterion being met, the second set of field-of-view parameters to be used for a magnetic resonance scan yet to take place is automatically ascertained such that the portion of the unmapped region of the used, original field of view, without taking into account the distortion, is below a further threshold value and/or the mapped region of the field of view associated with the second set of field-of-view parameters comprises all features to be shown.

9. The method as claimed in claim 1, wherein the unmapped region is ascertained by application of an inverse distortion correction in accordance with the distortion map to a mask image of the original field of view for ascertaining a resulting image, the unmapped region corresponding to portions of the resulting image located outside of the original field of view without considering the distortion.

10. The method as claimed in claim 9, wherein the mask image is determined based on a model and/or a previously-performed magnetic resonance scan such that the previous scan displays where in the original field of view, without considering the distortion, portions of the patient to be scanned are present, wherein only portions of the patient to be scanned in accordance with the mask image are considered for ascertaining the unmapped region.

11. The method as claimed in claim 9, wherein a second set of field-of-view parameters is automatically determined by, starting from the original field of view, determining an expanded field of view such that the expanded field of view comprises the unmapped region.

12. The method as claimed in claim 1, wherein, with enlargement of the field of view described by the second set of field-of-view parameters compared with the original field of view, a resolution is increased corresponding to a degree of enlargement.

13. A non-transitory computer program product having computer program code and that is loadable into a memory of the controller of the MR scanner, that when executed by the controller, causes the controller to perform the method of claim 1.

14. A non-transitory computer-readable storage medium with an executable program stored thereon, that when executed, instructs a processor to perform the method of claim 1.

15. A magnetic resonance scanner comprising:
a gradient coil arrangement configured to generate gradient fields to be used during a magnetic resonance scan for spatial encoding; and
a controller configured to perform distortion correction based on a distortion map of acquired magnetic resonance data sets at least for distortions caused by imperfections in the gradient fields, the controller being configured to:
ascertain exclusion information describing an unmapped region of an original field of view based on the distortion map for at least one first set of field-of-view parameters describing a rectangular or cuboidal original field of view, the unmapped region resulting from the distortion;
control a user interface to display the original field of view to be set together with an anatomy of the patient to be scanned, wherein the unmapped region is displayed based on the exclusion information and/or a limitation of the field of view display for exclusion of the unmapped region is adjusted based the exclusion information;
determine a second set of field-of-view parameters to be used for the MR scan based on the exclusion information; and
control the MR scanner to perform the magnetic resonance scan using the second set of field-of-view parameters.

16. A computer-implemented method for setting a field of view for a magnetic resonance (MR) scan of a patient with a MR scanner including a gradient coil arrangement configured to generate gradient fields to be used during the MR scan for spatial encoding and a controller configured to perform distortion correction based on a distortion map of acquired magnetic resonance data sets at least for distortions caused by imperfections of the gradient fields, the method comprising:
ascertaining, by the controller, exclusion information describing an unmapped region of an original field of view based on the distortion map for at least one first set of field-of-view parameters describing a rectangular or cuboidal original field of view, the unmapped region resulting from the distortion;
determining, by the controller, a second set of field-of-view parameters to be used for the MR scan based on the exclusion information; and
controlling, by the controller, the MR scanner to perform the magnetic resonance scan using the second set of field-of-view parameters, wherein:
(a) based on examination information describing anatomical features to be shown in the MR scan, automatically checking, by the controller, whether the mapped region of this original field of view comprises all features to be shown, starting from an original field of view containing the anatomical features without considering the distortion and/or from an original field of view selected by the user; and, in response to the mapped region not comprising all of the anatomical features to be shown: automatically ascertaining, the second set of field-of-view parameters such that the mapped region of the associated field of view comprises all features to be shown, and/or generating and outputting a warning to the user; or (b) the first set of view parameters describes a used, original field of view of a previously performed magnetic resonance scan, the controller automatically evaluating an action criterion to check whether the portion of the unmapped region of the used field of view, without taking into account the distortion, exceeds a threshold value and/or whether at least one feature to be shown in the magnetic resonance scan in accordance with an item of the examination information is located at least partially in the unmapped region; and, in response to the action criterion being met, the second set of field-of-view parameters to be used for a magnetic resonance scan yet to take place is automatically ascertained such that the portion of the unmapped region of the used, original field of view, without taking into account the distortion, is below a further threshold value and/or the mapped region of the field of view associated with the second set of field-of-view parameters comprises all features to be shown.

17. A non-transitory computer-readable storage medium with an executable program stored thereon, that when executed, instructs a processor to perform the method of claim 16.

18. A magnetic resonance scanner comprising:
a gradient coil arrangement configured to generate gradient fields to be used during a magnetic resonance scan for spatial encoding; and
a controller configured to perform distortion correction based on a distortion map of acquired magnetic resonance data sets at least for distortions caused by imperfections in the gradient fields, the controller being configured to perform the method of claim 16.

* * * * *